(12) United States Patent
Smith et al.

(10) Patent No.: US 11,610,795 B2
(45) Date of Patent: Mar. 21, 2023

(54) MEMBRANE DIFFUSER FOR A SUBSTRATE CONTAINER

(71) Applicant: ENTEGRIS, INC., Billerica, MA (US)

(72) Inventors: Mark V. Smith, Colorado Springs, CO (US); Nicholas Thelen, Colorado Springs, CO (US); Matthew A. Fuller, Colorado Springs, CO (US); Michael C. Zabka, New Prague, MN (US); Sung In Moon, Chaska, MN (US); John P. Puglia, Townsend, MA (US)

(73) Assignee: ENTEGRIS, INC., Billerica, MA (US)

( * ) Notice: Subject to any disclaimer, the term of this patent is extended or adjusted under 35 U.S.C. 154(b) by 706 days.

(21) Appl. No.: 16/552,005

(22) Filed: Aug. 27, 2019

(65) Prior Publication Data

US 2020/0075374 A1    Mar. 5, 2020

Related U.S. Application Data

(60) Provisional application No. 62/874,647, filed on Jul. 16, 2019, provisional application No. 62/837,389, filed on Apr. 23, 2019, provisional application No. 62/723,979, filed on Aug. 28, 2018.

(51) Int. Cl.
*H01L 21/673* (2006.01)
*H01L 21/67* (2006.01)

(52) U.S. Cl.
CPC .. *H01L 21/67393* (2013.01); *H01L 21/67017* (2013.01); *H01L 21/67376* (2013.01); *H01L 21/67386* (2013.01)

(58) Field of Classification Search
CPC ......... H01L 21/67393; H01L 21/67017; H01L 21/67376; H01L 21/67386; H01L 21/67253; H01L 21/6732; H01L 21/67383; H01L 21/67389; H01L 21/67772
USPC ......................................................... 95/273
See application file for complete search history.

(56) References Cited

U.S. PATENT DOCUMENTS

| | | | |
|---|---|---|---|
| 7,328,727 B2 | 2/2008 | Tieben | |
| 8,783,463 B2 | 7/2014 | Watson | |
| 9,054,144 B2 * | 6/2015 | Burns | ............... H01L 21/67376 |
| 10,101,047 B2 * | 10/2018 | Lo | ..................... H01L 21/67393 |
| 2008/0298933 A1 | 12/2008 | Hsiao | |
| 2015/0348810 A1 | 12/2015 | Burns | |
| 2015/0357218 A1 | 12/2015 | Lin | |
| 2016/0276190 A1 | 9/2016 | Smith | |
| 2018/0144965 A1 | 5/2018 | Maraschin | |

FOREIGN PATENT DOCUMENTS

| | | |
|---|---|---|
| JP | 11307623 A | 11/1999 |
| JP | 2002170874 A | 6/2002 |
| JP | 3939101 B2 | 7/2007 |

(Continued)

*Primary Examiner* — Vu A Vu

(57) ABSTRACT

Purge diffusers for use in systems for transporting substrates include: i) a purge diffuser core having an internal purge gas channel, one or more diffuser ports and an outer surface; ii) filter media secured to the outer surface of the purge diffuser core; and iii) a purge port connector for mounting the purge diffuser to a purge port of a substrate container for transporting substrates. The purge diffuser core may be a unitary article, may be formed by injection molding, and may include diverters internal to the internal purge gas channel.

19 Claims, 6 Drawing Sheets

(56) References Cited

FOREIGN PATENT DOCUMENTS

| | | | |
|---|---|---|---|
| JP | 2016105443 | A | 6/2016 |
| KR | 101601600 | B1 | 3/2016 |
| KR | 101748361 | B1 | 6/2017 |
| TW | 526559 | U | 8/2016 |
| WO | 2015057739 | A1 | 4/2015 |
| WO | 2016205191 | A1 | 12/2016 |

\* cited by examiner

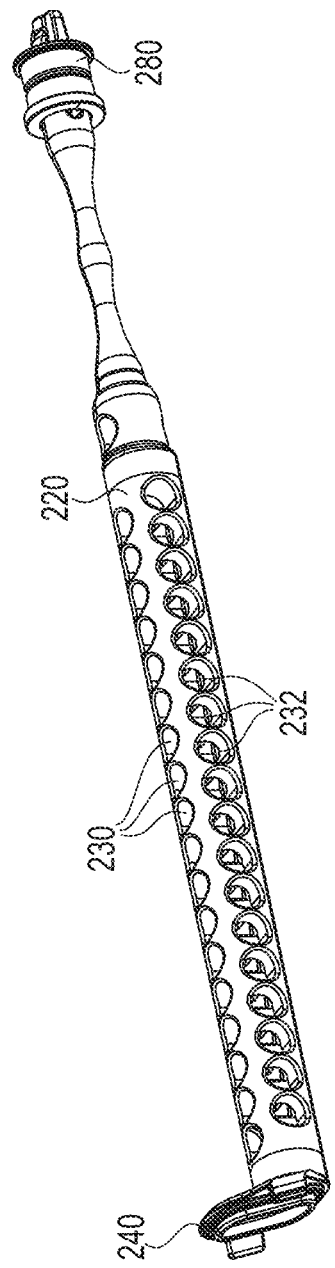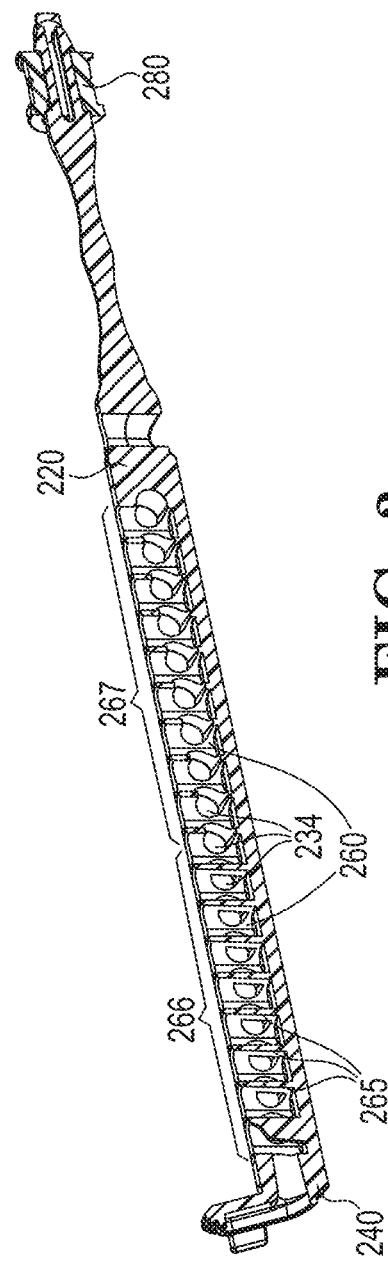

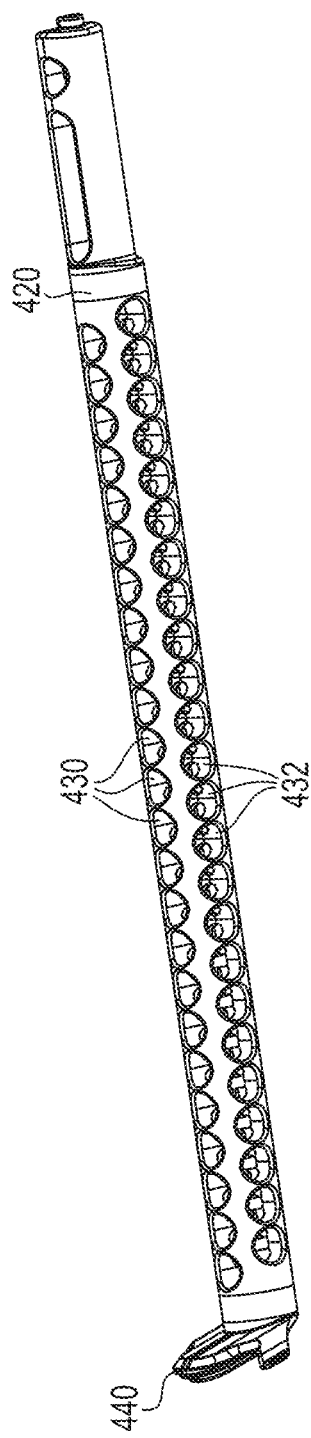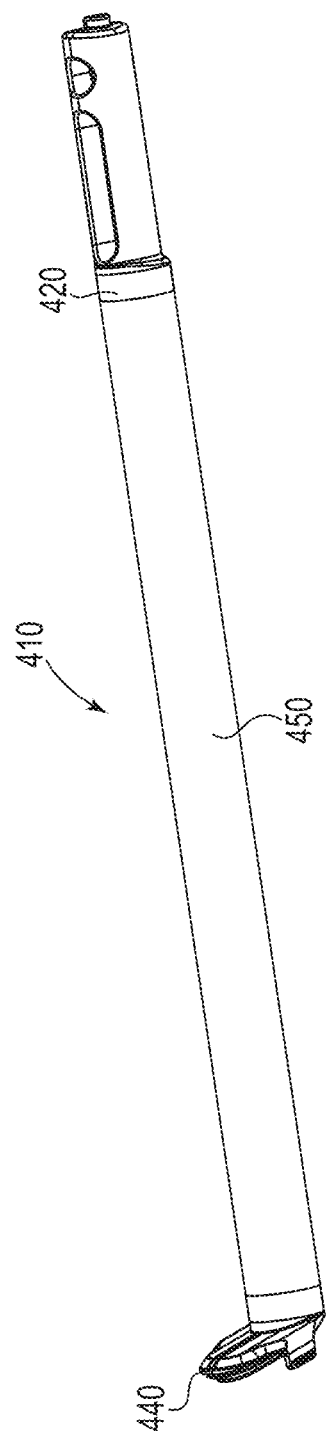
FIG. 4
FIG. 5

MEMBRANE DIFFUSER FOR A SUBSTRATE CONTAINER

CROSS-REFERENCE TO RELATED APPLICATIONS

This application claims the benefit of: U.S. Provisional Application No. 62/723,979, filed Aug. 28, 2018; U.S. Provisional Application No. 62/837,389, filed Apr. 23, 2019; and U.S. Provisional Application No. 62/874,647, filed Jul. 16, 2019, all of which are incorporated herein by reference in their entireties for all purposes.

TECHNICAL FIELD

This disclosure relates to systems for transporting or storing substrates which include a container and a system for purging the environment within the container to desired levels of relative humidity, oxygen, and airborne particulates.

BACKGROUND OF THE DISCLOSURE

In general, specialized carriers or containers are utilized for transporting and/or storing batches of silicon wafers or substrates before, during and after processing of the wafers or substrates. The term substrate as used herein can refer to one or more of semiconductor wafers, magnetic discs, flat panel substrates, and other such substrates.

Such containers are generally configured to axially arrange the substrates in slots, and to support the substrates in slots by or near their peripheral edges. The substrates are conventionally removable from the containers in a radial direction upwardly or laterally. Exemplary containers used to convey wafers or substrates can include front opening unified pods (FOUPs) or front opening shipping boxes (FOSBs). In certain configurations, the container portions of the substrate carriers have been provided with openings or passageways to facilitate the introduction and/or exhaustion of gases such as nitrogen or other purified gasses, into the internal environment of the carrier to displace ambient air that might contain contaminants.

During processing of semiconductor substrates or wafers, the presence of or generation of particulates can present significant contamination problems. Contamination is accepted as the single largest cause of yield loss in the semiconductor industry. As the size of integrated circuitry has continued to be reduced, the size of particles which can contaminate an integrated circuit has also become smaller making minimization of contaminants all the more critical.

Currently, to produce a clean space for accommodating substrates when transported or stored, the internal environment of the carrier is purged using an inert gas or clean dry air (CDA) which is injected into the interior of the container through an inlet port causing the air within the container to exit through an outlet port. These purge gas inlet and outlet ports are generally located on the bottom surface of the container body or shell and extend from the interior through the shell bottom surface where they interface with the purge gas delivery system. One goal of purging is to decrease humidity and oxygen levels in the internal volume of the microenvironment. A challenge of purging is to evenly distribute the purge gas fast and effectively over the substrates within the container. Another goal of purging is to remove airborne contaminants from the environment within the container. However, these contaminants may become trapped in filtering mechanisms of the purge system itself, leading to cross-contamination and requiring additional cleaning.

A need therefore exists for improved purging methods and equipment which solve the problems of evacuating the wafer container in a fast and efficient manner while at the same time controlling relative humidity and oxygen concentration internal environment of the wafer container. Additionally, a need exists for a purging method and apparatus that can allow high flow rates of purge gas at low pressure differentials while minimizing the propensity of the purge system itself to entrain contaminants.

SUMMARY

Briefly, the present disclosure provides purge diffusers for use in systems for transporting substrates as well as systems comprising such purge diffusers. According to various embodiments as described herein, the present disclosure provides a purge diffuser that minimizes particulate contamination while at the same time controlling relative humidity and oxygen concentrations within an internal environment of a container containing such a purge diffuser. Additionally, the purge diffuser is capable of controlling back pressure in the system so as not to lose a static seal interface with a static purge source during high flow rates of an inert gas while achieving particle filtration efficiencies of greater than 99%.

Purge diffusers according to the present disclosure generally include: i) a purge diffuser core having an internal purge gas channel, one or more diffuser ports and an outer surface; ii) filter media secured to the outer surface of the purge diffuser core; and iii) a purge port connector for mounting the purge diffuser to a purge port of a substrate container for transporting substrates. These elements are arranged such that purge gas entering through the purge port connector enters the internal purge gas channel, exits the internal purge gas channel through the diffuser ports, and passes through the filter media into the interior of a substrate container. In some embodiments, the purge diffuser core is a unitary article of integral construction and, in some cases, is fabricated from an injection-moldable, melt processable polymer in a single molding. In various non-limiting embodiments, the filter media can be directly bound to the outer surface of the purge diffuser core, e.g., by weld bonds, secured to the outer surface of the purge diffuser core by an adhesive, or secured to the outer surface of the purge diffuser core by a filter media bracket, in which case the filter media is secured between the purge diffuser core and the filter media bracket and the filter media bracket is attached to the purge diffuser core. Such a filter media bracket may be attached to the purge diffuser core by welding, friction fit, adhesive, fasteners, or other mechanisms. In certain embodiments, the filter media can include a mesh scrim disposed or wrapped over the outer surface of the filter media to protect the filter media.

According to various embodiments, the filter media is a porous hydrophobic film or membrane including a polyolefin, polyester, polysulfone, or fluoropolymer, and can have a thickness of between: 10 and 1300 micrometers; of between 10 and 1000 micrometers; of between 10 and 500 micrometers; or of between 40 and 150 micrometers. In some embodiments, the filter media is porous hydrophobic membrane, and in certain embodiments, the filter media is a hydrophobic ultra-high molecular weight polyethylene (UPE) membrane. In many cases, the membrane or film is preferably not pleated and is a non-pleated membrane or film. The film or membrane can be employed to enable sieving or non-sieving of contaminants, depending on the potential contaminants.

According to various embodiments, the purge diffuser core includes a plurality of diffuser ports. Purge gas exits the internal purge gas channel through diffuser ports and passes through the filter media disposed or wrapped over the purge diffuser core and into the interior of the substrate container.

In some embodiments, the purge diffuser core additionally includes one or more diverters which project into the internal purge gas channel from an inner surface of the purge diffuser core bordering the internal purge gas channel. In some embodiments, the diverters are staggered to enable injection-molding of the purge diffuser core as a unitary article in a single molding.

In other embodiments, the present disclosure provides systems including purge diffusers according to the present disclosure and a substrate container including a container portion with an opening, a door adapted to be received in the opening so as to seal the internal environment of the substrate container, and a purge port to admit purge gas to an interior of the substrate container. The purge diffuser is mounted by its purge port connector to the purge port. In some embodiments the substrate container is a Front Opening Unified Pod (FOUP).

In another embodiment, the present disclosure provides methods of making purge diffusers according to the present disclosure, comprising: a) molding the purge diffuser core as single unitary article; and b) securing filter media to the outer surface of the purge diffuser core. In some embodiments, molding the purge diffuser core as single unitary article is accomplished by injection molding. In some embodiments, securing filter media to the outer surface of the purge diffuser core is accomplished by welding methods such as impulse welding.

In still another embodiment, the present disclosure provides methods of purging a system for transporting substrates according to the present disclosure comprising passing a flow of purge gas through the purge port into the purge diffuser and thereby into the interior of the substrate container. In some embodiments, the purge gas is nitrogen and the purge diffuser provides a greater flow of purge gas to lower portions of the interior of the substrate container than to higher portions of the interior of the substrate container.

The preceding summary of the present disclosure is not intended to describe each embodiment of the present disclosure. The details of one or more embodiments of the disclosure are also set forth in the description below. Other features, objects, and advantages of the disclosure will be apparent from the description and from the claims.

BRIEF DESCRIPTION OF THE DRAWING

The disclosure may be more completely understood in consideration of the following description of various illustrative embodiments in connection with the accompanying drawings

FIG. 2 is a perspective view of one embodiment of a purge diffuser core according to the present disclosure.

FIG. 3 is a cutaway view of the purge diffuser core of FIG. 2.

FIG. 4 is a perspective view of one embodiment of a purge diffuser core according to the present disclosure.

FIG. 5 is a perspective view of one embodiment of a purge diffuser according to the present disclosure incorporating the purge diffuser core of FIG. 4.

Figure 1:
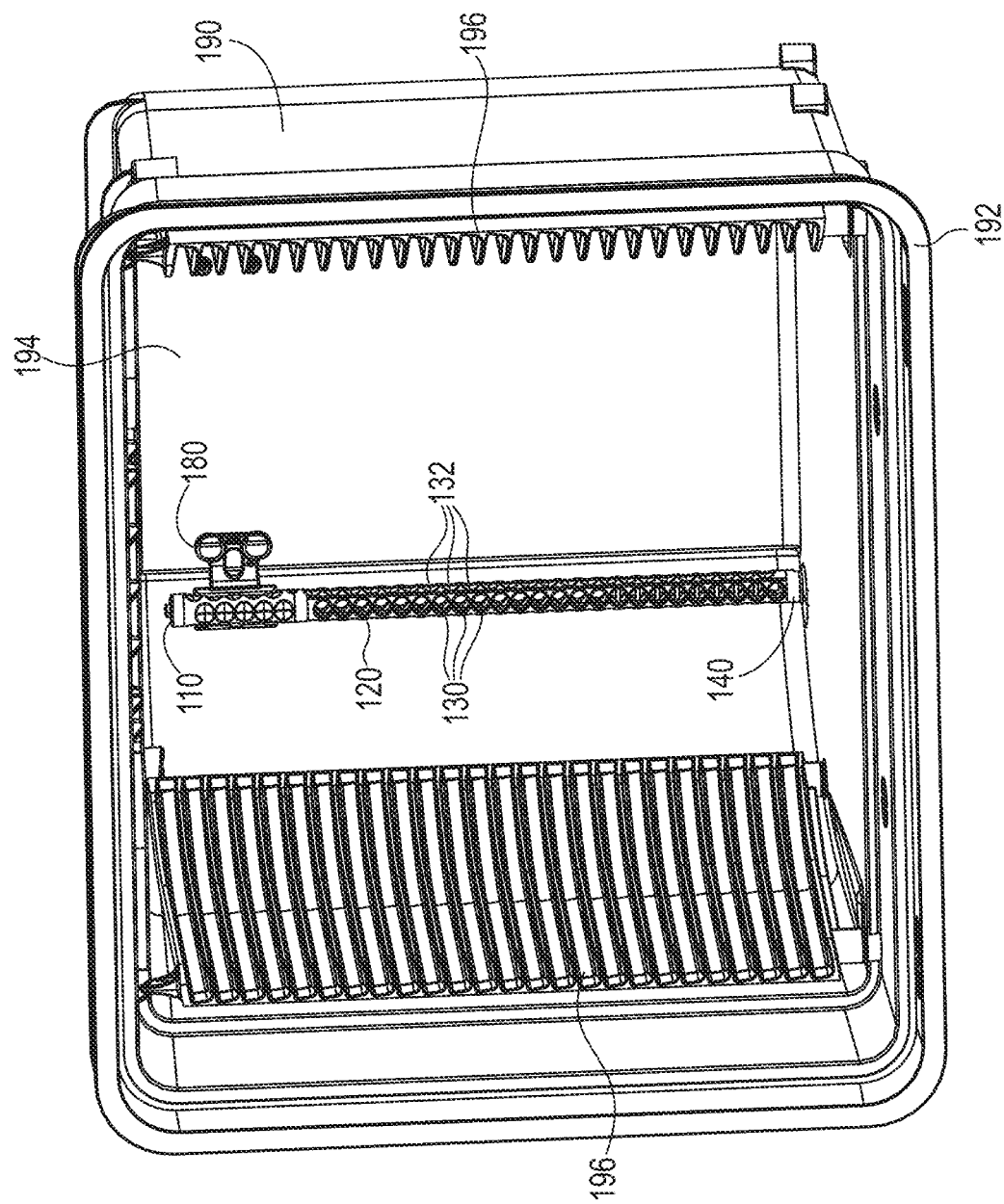
FIG. 1 is a perspective view of one embodiment of a system for transporting substrates according to the present disclosure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

The term "about" generally refers to a range of numbers that is considered equivalent to the recited value (e.g., having the same function or result). In many instances, the term "about" may include numbers that are rounded to the nearest significant figure.

The term "directly bound" refers to two materials that are in direct contact with each other and bound together.

The term "integral" or "integral construction" refer to a construction that is a single piece, though it may include elements that can be separately named, that may be a unitary article, or that may be formed from multiple pieces where multiple pieces are permanently joined (such as by welding, permanent adhesive, permanent fasteners, or methods that cannot be reversed non-destructively) to form a single piece construction.

The term "unitary" or "unitary article" refer to an article that is a single piece, though it may include elements that can be separately named, that is formed from a single piece or aliquot of material without division of that piece or aliquot (such as by stamping, molding, forging, machining, sculpting, or the like), and that lacks seams or joints between elements.

Numerical ranges expressed using endpoints include all numbers subsumed within that range (e.g. 1 to 5 includes 1, 1.5, 2, 2.75, 3, 3.80, 4 and 5).

All scientific and technical terms used herein have meanings commonly used in the art unless otherwise specified.

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

The present disclosure provides purge diffusers for use in systems for transporting substrates, and systems comprising such purge diffusers. Such systems typically include a substrate container comprising a container portion including a top wall, a bottom wall, a back wall and two side walls defining an opening, a door adapted to be received in the opening to seal the internal environment, and a purge port to admit purge gas to an interior of the substrate container. Some such substrate containers are typically known as a FOUPs or FOSBs. Substrates may be inserted and removed, typically horizontally through an open front. Slots formed in the interior sides hold the substrates, most typically semiconductor wafers. The door engages with the enclosure to form a sealed interior space that is isolated from the ambient atmosphere. Typically, the door and substrate container are adapted to be manipulated by automated or robotic mechanisms. Likewise, substrates may be placed in or removed from the substrate container by automated or robotic mechanisms. The purge port may be in the bottom wall (or floor) of the enclosure portion, and typically includes hardware to mount and form a seal with the purge port connector of a purge diffuser.

The purge diffuser, according to the various embodiments described herein, is adapted to distribute purge gas in the interior of the substrate container. Purge gas is directed through the purge port and purge port connector into the purge gas channel interior to the purge diffuser. The purge gas exits the internal purge gas channel through diffuser ports and passes through the filter media into the interior of a substrate container. By use of a purge diffuser, the distribution of purge gas within the interior of the substrate container may be controlled to avoid dead spots and achieve desired distribution. Any suitable purge gas may be used, which may include clean dry air (CDA) and inert gasses such as nitrogen. The design of the purge diffuser may be adapted to the selected purge gas. For example, where a lighter-than-air gas such as nitrogen is in use, greater flow to lower portions of the interior of the substrate container may result in a more even purging of the container and its contents from contaminants, particulates, and humidity. In some embodiments, the substrate container may additionally include a purge outlet port to allow purge gas to flow out of the container. In others, the container is purged with the door removed and purge gas exits through the open front of the container.

Purge diffusers according to the present disclosure include a purge diffuser core having an internal purge gas channel and one or more diffuser ports allowing exit of purge gas from the internal purge gas channel to the exterior of the purge diffuser core and into the interior of the substrate container. The purge diffuser core may include features for attachment to mounting apparatus, typically at the end of the purge diffuser core opposite the purge port connector. In some embodiments, the purge diffuser core is of an integral construction such that it is a unitary article. The purge diffuser core may be fabricated any suitable material, which may include injection-moldable materials, melt processable polymers, fluoropolymers, polyolefins, or fluorinated polyolefins. In some cases, the purge diffuser core can be fabricated from carbon-filled materials to facilitate the elimination of electro-static discharge. The material from which the purge diffuser core is fabricated should be selected to minimize outgassing.

In some cases, the purge diffuser can be sized so as to minimize the material mass of the purge diffuser within the internal environment of the substrate container. Material mass in a substrate container can absorb off-gassing (Airborne Molecular Contamination—AMC) from wafer processes such as boron, ammonia, chlorine or fluorene and then later desorb these contaminants back into the container environment potentially causing wafer yield loss. Reducing the amount of material in the internal environment can improve the propensity for AMC absorption and desorption. One method for reducing material mass within the internal environment of the wafer container is to reduce the overall length or height of the purge diffuser relative to the interior height of the substrate container and more particularly, relative to the interior height of the substrate as measured from a top wall of the container portion to the bottom wall of the container portion of the substrate container. In some embodiments, the length or height of the purge diffuser is not more than 85% of the height of the interior of the substrate container as measured from the top wall to the bottom wall of the container portion of the substrate container, in others not more than 75%, 65%, 60%, 55%, 50%, 45% or 40% of the height of the substrate container. In some such embodiments, the length or height of the purge diffuser is at least 20% of the interior height of the substrate container, in others at least 25%, 30%, or 35% of the interior height of the substrate container. In some cases, the purge diffuser can have a length ranging from: 100 mm to 170 mm; 105 mm to 160 mm; or from 110 mm to 150 mm. In one particular embodiment, the purge diffuser has a length of 150 mm. In another embodiment, the purge diffuser has a length of 110 mm. The overall length of the purge diffuser as measured relative to the height of the substrate container can be selected or optimized based on the intended application. For example, the length of the purge diffuser can be optimized based on the type of purge gas, the flow rate of the purge gas, and/or the acceptable levels of relative humidity and oxygen in the environment of the container and/or the nature of the contaminants to be entrained by the purge diffuser, but not limited to these. In some embodiments, a purge diffuser having a reduced height or length relative to the height or of the substrate container can be used with in combination with other embodiments, as disclosed herein, used to reduce contaminants within the internal environment of the container and/or for controlling relative humidity and oxygen levels.

The internal purge gas channel may have a length equal to or less than the length of the purge diffuser core. In some embodiments, the length of the internal gas channel is not more than 85% of the interior height of the substrate container, in others not more than 75%, 65%, 60%, 55%, 50%, 45% or 40%. In some such embodiments, the length of the internal gas channel is at least 20% of the interior height of the substrate container, in others at least 25%, 30%, or 35%.

The purge diffuser can include a plurality of diffuser ports distributed along the length of the purge diffuser core. Purge gas exits the internal purge gas channel through diffuser ports. In some cases, the purge gas exits the internal purge gas channel and passes through filter media disposed or wrapped over the purge diffuser core and into the interior of the substrate container. The diffuser ports can have any suitable shape, size, and position along the length of the purge diffuser core. The distribution and characteristics of diffuser ports may be selected to achieve a desired distribution of purge gas flow and be uniform or may vary. In some embodiments, rows of diffuser ports are offset from each other such that every portion of the internal purge gas channel between the diffuser port closest to the purge port connector and the diffuser port most distant from the purge port connector may be accessed through a diffuser port along a line perpendicular to the length of the purge diffuser. This design enables manufacture of the purge diffuser core as a unitary article with a continuous interior channel (the internal purge gas channel) by molding processes, such as an injection molding process using side pulls, cams, cam actions or slides.

In some embodiments, the purge diffuser core additionally includes diverters which project into the internal purge gas channel from an inner surface of the purge diffuser core, i.e., an internal surface of the purge diffuser core bordering the internal purge gas channel. The diverters may be of any suitable shape, such as fins or pegs, or may bridge across the internal purge gas channel from a first location on the inner surface of the purge diffuser core to a second, separate, location on the inner surface of the purge diffuser core. The diverters may impede but typically do not block flow of purge gas to further portions of the internal purge gas channel. The distribution and characteristics of diverters may be selected to achieve a desired distribution of purge gas flow. The distribution and characteristics of diverters may be uniform along the length of the internal purge gas channel or may vary. In some embodiments, the diffuser core includes diverters in a first segment of the internal purge gas channel proximal to the purge port and does not include diverters in a second segment of the internal purge gas channel distal from the purge port.

The purge diffuser core can be fabricated by any suitable method. Typically. hot melt molding methods may be used, such as injection molding. In some cases, as described herein, the purge diffuser core is injection molded to produce an integrally formed, unitary article.

Purge diffusers according to the present disclosure include filter media disposed over and secured to the outer surface of the purge diffuser core. The filter media may be present in segments or, more typically, may be in the form of a single sheet wrapped around the circumference of the purge diffuser core. In some embodiments, the filter media is directly bound to the outer surface of the purge diffuser core, such as by weld bonds, including without limitation heat-weld bonds, impulse-weld bonds and ultrasonic-weld bonds. Welding or bonding the filter media to the purge diffuser core provides the desirable feature of leak-proof bonding the filter media to the purge diffuser core without the use of adhesives or fasteners.

In other embodiments, the filter media is secured to the outer surface of the purge diffuser core by an adhesive. In still other embodiments, the filter media is secured to the outer surface of the purge diffuser core by a filter media bracket, wherein the filter media is secured between the purge diffuser core and the filter media bracket and the filter media bracket is attached to the purge diffuser core. A filter media bracket may be attached to the purge diffuser core by welding, friction fit, adhesive, fasteners, or other suitable mechanisms. After attachment, filter media make be shrunk in place by application of heat to generate a tighter fit to the purge diffuser core. Typically, the filter media covers each diffuser port of the purge diffuser core. Typically, the filter media is attached such that purge gas exiting through diffuser ports cannot enter the interior of the substrate container without passing through the filter media. In some embodiments, the filter media can be provided with a mesh scrim disposed over the filter media to provide protection to the filter media and to permit safe handling of the filter media. The mesh scrim may be affixed to the filter media without adhesives or fasteners. In some cases, the mesh scrim can be wrapped about an outer surface of the filter media. Alternatively, the mesh scrim can be impulse welded to the filter media.

The filter media may be of any suitable material that is useful for controlling relative humidity and oxygen may additionally remove particulates from a gas stream passing through the filter media. In various embodiments, the filter media may include woven, non-woven, sieving, non-sieving, melt blown, core and sheath, film, or membrane materials and may include polyolefin (including polypropylene, polyethylene, high density polyethyelene, or ultra-high molecular weight polyethylene), polyester, polysulfone, fluoropolymer, polyamide or polyimide polymers. The filter media is preferably not pleated such that it is a non-pleated filter media. In some embodiments, the filter media is a porous hydrophobic film. In other embodiments, the filter media is a porous hydrophobic membrane. In one embodiment, the filter media is a porous hydrophobic ultra-high molecular weight polyethylene membrane. Filter media may be laser-ablated to modify porosity. In some embodiments the filter media has a thickness of between; 10 and 1300 micrometers; of between 10 and 1000 micrometers; of between 10 and 500 micrometers; or of between 40 and 150 micrometers.

In one aspect, filter media can be characterized with regard to a property known as "bubble point," which is an understood property of a porous filter membrane. Bubble point corresponds to pore size, which may correspond to filtering performance, e.g., as measured by retention. A smaller pore size can correlate to a higher bubble point and often to higher filtering performance (higher retention). Preferred membranes for the filter media exhibit a combination of a relatively higher bubble point and a useful level of flow (flow rate). Examples of useful mean bubble points of membrane filter media can be in a range from 2 to 400 psi, e.g., in a range from 5 to 15 psi. To measure the mean bubble point, a sample of filter media is placed in a holder. Air is pressurized through the holder and the flow rate measured as a function of pressure. A low surface tension fluid, HFE-7200 (3M) is then introduced to the membrane to wet the membrane. Air is pressurized through the holder at the interior of the filter media, and the air flow is measured as a function of pressure. The mean bubble point is the pressure at which the ratio of the air flow of the wet membrane to the air flow of the dry membrane is 0.5. The test is performed at a temperature in a range of between 20 and 25 degrees Celsius.

In some embodiments, exemplary membrane filter media may have pores of a size (average pore size) to be considered either a microporous filtration membrane or an ultrafiltration membrane. A microporous membrane can have an average pore size in a range on from about 0.05 micrometers to about 10 micrometers. An ultrafiltration membrane can have an average pore size in a range from 0.001 micrometers to about 0.05 micrometers. Pore size is often reported as average pore size of a porous material, which can be measured by known techniques such as by Mercury Porosimetry (MP), Scanning Electron Microscopy (SEM), Liquid Displacement (LLDP), or Atomic Force Microscopy (AFM).

Purge diffusers according to the present disclosure typically include a purge port connector for mounting the purge diffuser to a purge port of a substrate container. In some embodiments, the purge port connector is an integral construction with the purge diffuser core such that the purge core and the purge port connector form a unitary article. In other embodiments, the purge port connector is part separate from but attachable to the purge diffuser core. The purge port connector and purge diffuser core are typically connected in a sealable manner, such that purge gas does not escape the purge diffuser between the purge port connector and purge diffuser core. The purge port connector may be made of any suitable material, including those recited above for the purge diffuser core.

With reference to FIG. 1, a system for transporting substrates according to one embodiment of the present disclosure includes substrate container 190. Front edge 192 of substrate container 190 surrounds a front opening and is adapted to accept a door (not shown) adapted to seal the opening defined by front edge 192. Typically, the door (not shown) and substrate container 190 are adapted to be manipulated by automated or robotic mechanisms. Purge diffuser 110 is depicted without filter media secured to the outer surface, revealing purge diffuser core 120. Purge diffuser core 120 includes diffuser ports 130, 132 arranged in lengthwise rows, according to an embodiment. In the embodiment depicted in FIG. 1, a first row of diffuser ports 130 is offset from a second row of diffuser ports 132, with the centers of diffuser ports 130 generally aligned with the boundaries between diffuser ports 132 and vice versa. Purge diffuser core 120 also includes an internal purge gas channel (not visible). Purge port connector 140 is attached to the bottom end of purge diffuser core 120. Purge port connector 140 is mounted to a purge port (not visible, as it is occupied and covered by purge port connector 140). The purge port passes through substrate container 190. During purge of substrate container 190, purge gas enters through the purge port into purge port connector 140 and thereby into the internal purge gas channel of purge diffuser core 120. The purge gas then exits the internal purge gas channel through diffuser ports 130, 132. When filter media is installed on the outer surface of purge diffuser core 120, purge gas exiting the internal purge gas channel through diffuser ports 130, 132. passes through the filter media, and into interior 194 of substrate container 190. Substrate container 190 is also equipped with substrate supports 196 which define slots for storage of substrates (not shown) by or near their peripheral edges. Optional mounting hardware 180 can provide additional attachment of purge diffuser 110 to substrate container 190, as necessary or desired.

With reference to FIGS. 2 and 3, these figures are a perspective view and a cutaway view (respectively) of one embodiment of a purge diffuser core according to the present disclosure. Purge diffuser core 220 is connected at its bottom end to purge port connector 240. Purge port connector 240 is adapted to connect to a purge port of a substrate container. Purge diffuser core 220 includes internal purge gas channel 260, which provides passage of purge gas entering through the purge port through purge port connector 240 to all diffuser ports 230, 232, 234. Purge diffuser core 220 includes diffuser ports 230, 232, 234 arranged in lengthwise rows. In some embodiments, as depicted in FIGS. 2 and 3, the row of diffuser ports 230 is offset from the rows of diffuser ports 232, 234, with the centers of diffuser ports 230 generally aligned with the boundaries between diffuser ports 232, 234 and vice versa. When diffuser ports 230, 232, 234 are staggered in this manner, every portion of internal purge gas channel 260 between the diffuser port closest to the purge port connector and the diffuser port most distant from the purge port connector may be accessed through a diffuser port along a line perpendicular to the length of the purge diffuser. This design enables manufacture of purge diffuser core 220 as a unitary article with a continuous interior channel (internal purge gas channel 260) by molding processes, such as an injection molding process using side pulls, cams, cam actions or slides. Purge diffuser core 220 is adapted to engage with mounting hardware component 280.

Purge diffuser core 220 optionally may additionally include diverters 265 which project into internal purge gas channel 260 from inner surfaces of purge diffuser core 220 which border internal purge gas channel 260. Diverters 265 slow and/or direct the flow of purge gas, but do not fully block flow of purge gas to further points along internal purge gas channel 260. In this embodiment, diverters 265 bridge across internal purge gas channel 260 from a first location on the inner surface of purge diffuser core 220 to a second and separate location on the inner surface of purge diffuser core 220. In this embodiment, purge diffuser core 220 includes diverters 265 in first segment 266 of internal purge gas channel 260, proximal to purge port connector 240, and does not include diverters in second segment 267 of internal purge gas channel 260 distal to purge port connector 240.

With reference to FIGS. 4 and 5, FIG. 4 is a perspective view of one embodiment of a purge diffuser core according to the present disclosure. FIG. 5 is a perspective view of one embodiment of a purge diffuser according to the present disclosure incorporating the purge diffuser core of FIG. 4. Purge diffuser 410 includes purge diffuser core 420. Purge diffuser core 420 is connected at its bottom end to purge port connector 440. Purge port connector 440 is adapted to connect to a purge port of a substrate container. Purge diffuser core 420 includes an internal purge gas channel (not visible), which provides passage of purge gas entering through the purge port through purge port connector 440 to all diffuser ports 430, 432. Purge diffuser core 420 includes diffuser ports 430, 432 arranged in lengthwise rows. The row of diffuser ports 430 is offset from the rows of diffuser ports 432, with the centers of diffuser ports 430 generally aligned with the boundaries between diffuser ports 432 and vice versa. As noted above, when diffuser ports 430, 432 are staggered in this manner, every portion of the internal purge gas channel between the diffuser port closest to the purge port connector and the diffuser port most distant from the purge port connector may be accessed through a diffuser port along a line perpendicular to the length of the purge diffuser. This design enables manufacture of purge diffuser core 420 as a unitary article with a continuous interior channel (the internal purge gas channel) by molding processes, such as an injection molding process using side pulls, cams, cam actions or slides.

Figure 6B:
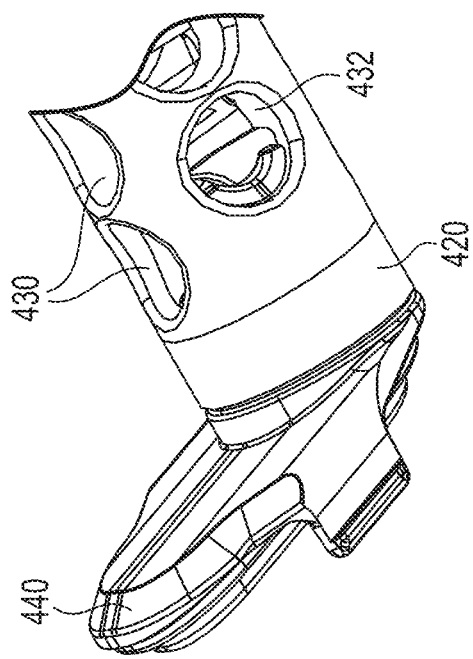
FIGS. 6A and 6B are perspective views of a detail of one embodiment of a purge diffuser core of FIG. 4.
Figure 6A:
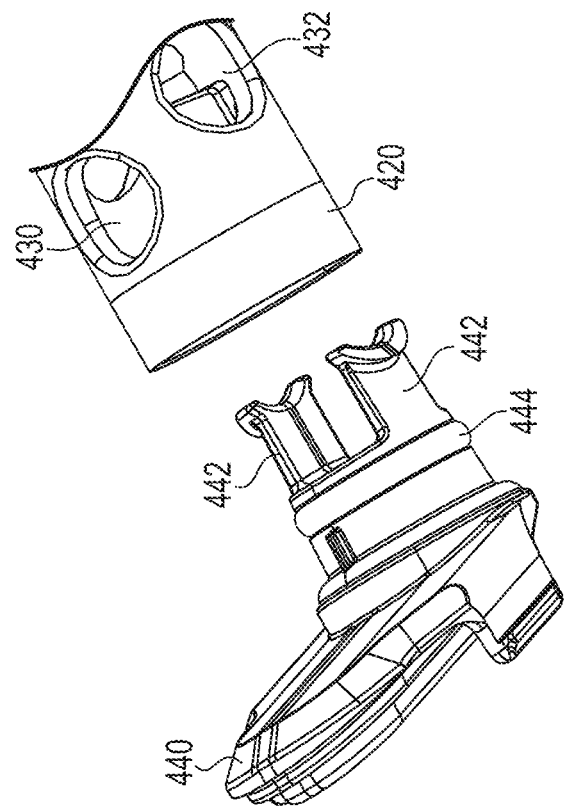

With reference to FIGS. 6A and 6B, these figures are perspective views of a detail of the purge diffuser core of FIG. 4 and its assembly. Purge diffuser core 420 is connected at its bottom end to purge port connector 440. Engaging tabs 442 securely attach purge port connector 440 to purge diffuser core 420. Seal 444 prevents escape of purge gas at the interface between purge port connector 440 and purge diffuser core 420. Diffuser ports 430, 432 are shown.

Referring again to FIG. 5, filter media 450 is secured to the outer surface of purge diffuser core 420 such that purge gas from the purge port entering purge diffuser 410 through purge port connector 440 enters the internal purge gas channel, exits the internal purge gas channel through diffuser ports 430, 432, and passes through filter media 450 into the interior of the substrate container.

Figure 7B:
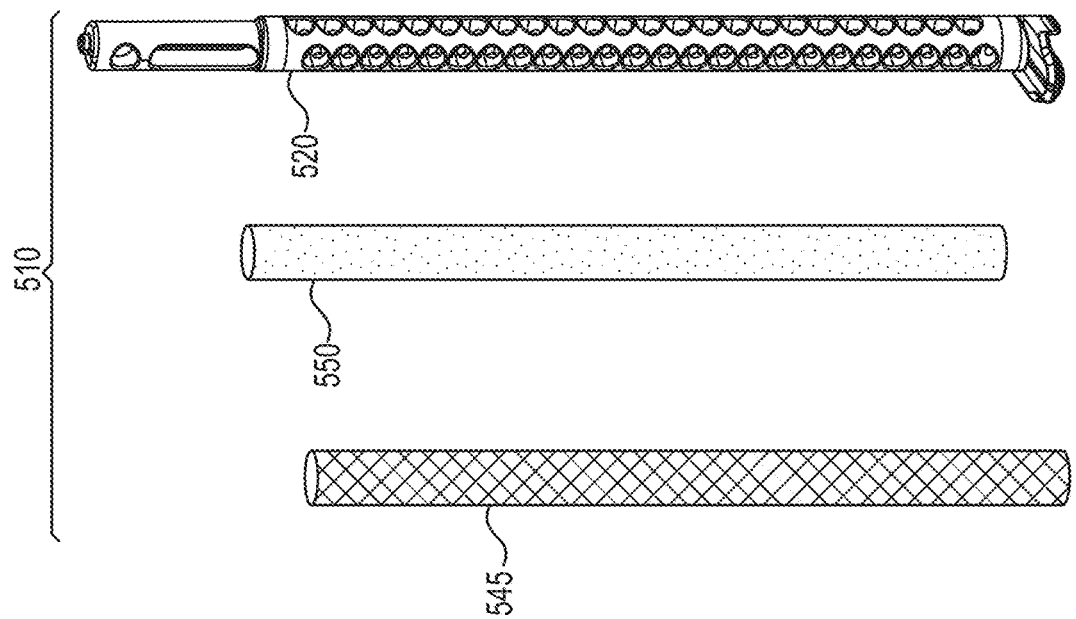
FIG. 7B is an exploded view of the purge diffuser of FIG. 7B.
Figure 7A:
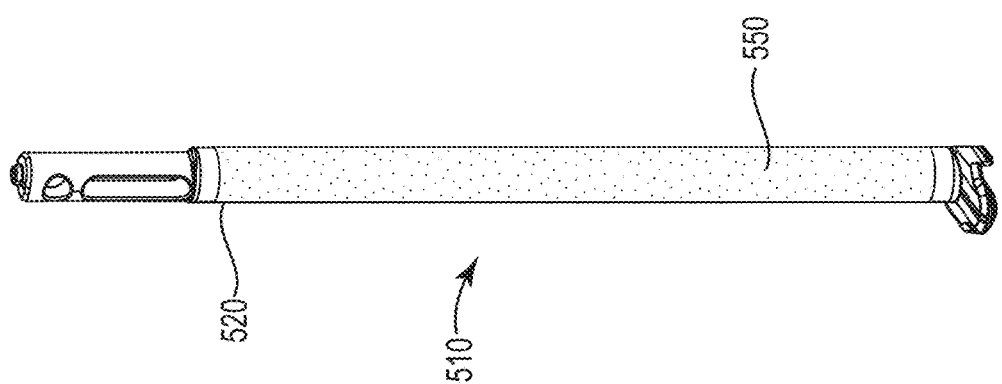
FIG. 7A is a perspective view of a purge diffuser according to an embodiment of the present disclosure.

FIG. 7A is a perspective view and FIG. 7B is an exploded view of a purge diffuser 510 according to yet another embodiment. Purge diffuser 510 includes a porous membrane disposed over purge diffuser core 520. Similar to those embodiments discussed above with reference to FIGS. 4 and 5, Purge diffuser core 520 is connected at its bottom end to purge port connector 540. Purge port connector 540 is adapted to connect to a purge port of a substrate container. Purge diffuser core 520 includes an internal purge gas channel (not visible), which provides passage of purge gas entering through the purge port through purge port connector 540 to all diffuser ports 530, 532. Purge diffuser core 520 includes diffuser ports 530, 532 arranged in lengthwise rows. The row of diffuser ports 530 is offset from the rows of diffuser ports 532, with the centers of diffuser ports 530 generally aligned with the boundaries between diffuser ports 532 and vice versa. As noted above, when diffuser ports 530, 532 are staggered in this manner, every portion of the internal purge gas channel between the diffuser port closest to the purge port connector and the diffuser port most distant from the purge port connector may be accessed through a diffuser port along a line perpendicular to the length of the purge diffuser. Filter media 550 is secured to the outer surface of purge diffuser core 520 such that purge gas from the purge port entering purge diffuser 510 through purge port connector 540 enters the internal purge gas channel, exits the internal purge gas channel through diffuser ports 530, 532, and passes through filter media 550 into the interior of the substrate container.

As shown in FIG. 7B, a mesh scrim 545 can be disposed over disposed over the filter media 550 to provide protection to the filter media 550 and to permit safe handling of the filter media 550. The mesh scrim may be affixed to the filter media without adhesives or fasteners. In some cases, the mesh scrim 545 can be wrapped about an outer surface of the filter media 550. Alternatively, the mesh scrim 545 can be impulse welded to the filter media 550.

As described herein filter media 450, 550 may be of any suitable material that is useful for controlling relative humidity and oxygen may additionally remove particulates from a gas stream passing through the filter media. In various embodiments, the filter media may include woven, non-woven, sieving, non-sieving, melt blown, core and sheath, film, or membrane materials and may include polyolefin (including polypropylene, polyethylene, high density polyethyelene, or ultra-high molecular weight polyethylene), polyester, polysulfone, fluoropolymer, polyamide or polyimide polymers. The filter media is preferably not pleated such that it is a non-pleated filter media. In some embodiments, the filter media is a porous hydrophobic film. In other embodiments, the filter media is a porous hydrophobic membrane. In a preferred embodiment, the filter media is a porous hydrophobic ultra-high molecular weight polyethylene (UPE) membrane. In some cases, the UPE membrane is selected such that it provides greater than 99% particle retention and less than 65 kPa of backpressure in the system.

Figure 8:
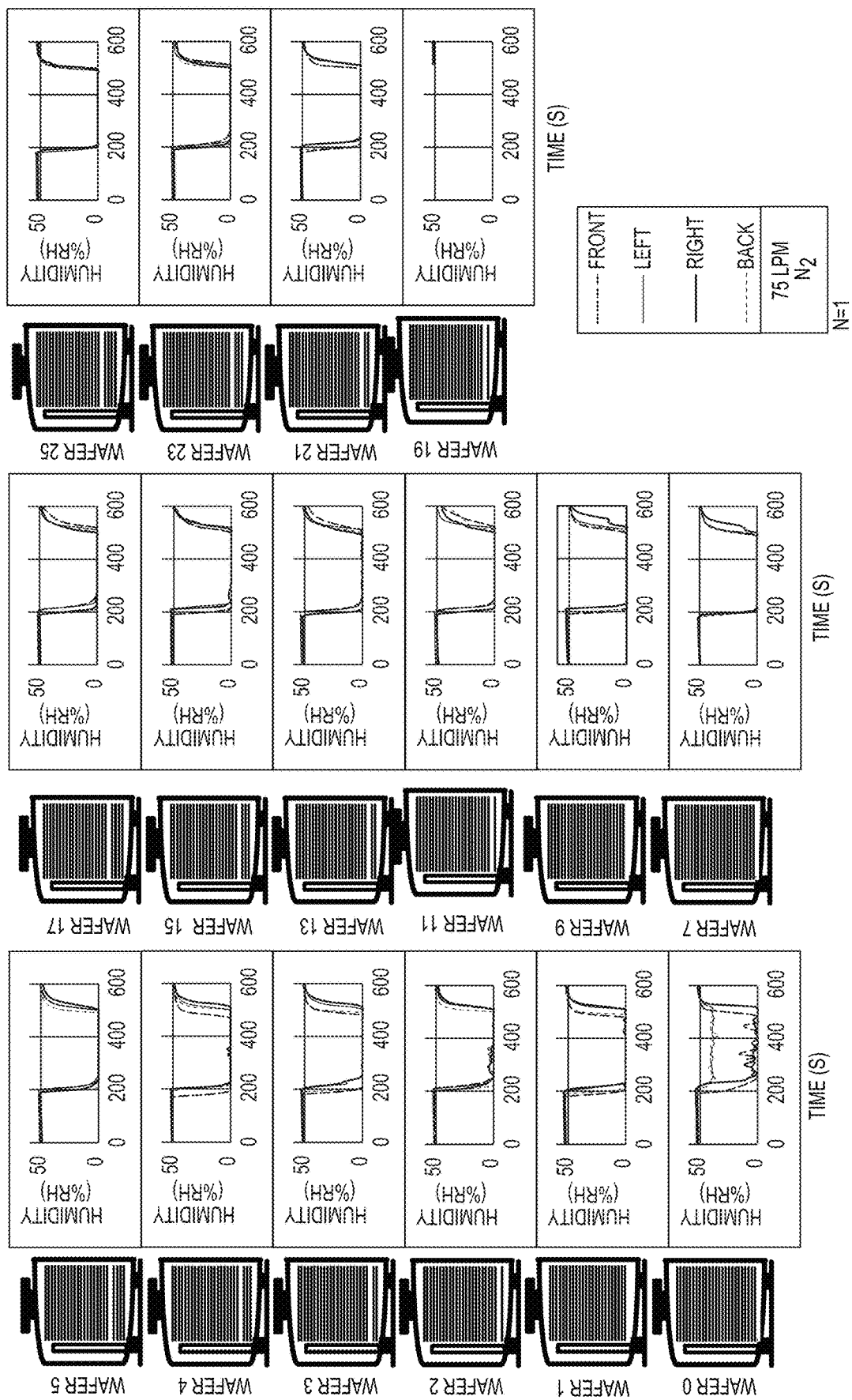
FIG. 8 is a graphic showing the open door relative humidity performance of a purge diffuser according to an embodiment of the present disclosure.

FIG. 8 is a graphic showing the open door relative humidity (RH %) performance of a purge diffuser including a UPE membrane, in accordance with embodiments described herein. Relative humidity levels were measured using a sensor positioned at the front, left right and back of the substrate container. The initial relative humidity level in the environment was 50% RH. Purge gas was introduced into the substrate container with the door removed. The test was repeated for each of the twenty-five wafers contained within the substrate container. As shown in FIG. 8, the UPE membrane purge diffuser is effective at minimizing the relative humidity levels in the container environment at each wafer and at each position during the open door purge test.

SELECTED EMBODIMENTS

The following numbered embodiments are intended to further illustrate the present disclosure but should not be construed to unduly limit this disclosure.

Embodiment 1

A system for transporting substrates comprising:
a) a substrate container comprising a container portion with an opening, a door adapted to seal the opening, and a purge port to admit purge gas to an interior of the substrate container; and
b) a purge diffuser mounted to the purge port, the purge diffuser comprising:
  i) a purge diffuser core having an internal purge gas channel, one or more diffuser ports and an outer surface; and
  ii) filter media secured to the outer surface of the purge diffuser core;
arranged such that there is a continuous path for purge gas entering through the purge port to enter the internal purge gas channel, exit the internal purge gas channel through the diffuser ports, and pass through the filter media into the interior of the substrate container.

Embodiment 2

The system according to embodiment 1 wherein the purge diffuser core is a unitary article.

Embodiment 3

The system according to embodiment 1 wherein the purge diffuser core is a unitary article comprising an injection-moldable material and made in a single molding.

Embodiment 4

The system according to embodiment 3 wherein the injection-moldable material is a melt processable polymer.

Embodiment 5

The system according to any of embodiments 1-4 wherein the filter media is directly bound to the outer surface of the purge diffuser core.

Embodiment 6

The system according to embodiment 5 wherein the filter media is directly bound to the outer surface of the purge diffuser core by weld bonds.

Embodiment 7

The system according to embodiment 5 wherein the filter media is directly bound to the outer surface of the purge diffuser core by weld bonds selected from heat-weld bonds, impulse-weld bonds and ultrasonic-weld bonds.

Embodiment 8

The system according to any of embodiments 1-4 wherein the filter media is secured to the outer surface of the purge diffuser core by an adhesive.

Embodiment 9

The system according to any of embodiments 1-4 wherein the filter media is secured to the outer surface of the purge diffuser core by a filter media bracket, wherein the filter media is secured between the purge diffuser core and the filter media bracket and the filter media bracket is attached to the purge diffuser core.

Embodiment 10

The system according to any of embodiments 1-9 wherein the filter media is a porous hydrophobic film comprising a polyolefin, polyester, polysulfone, or fluoropolymer.

Embodiment 11

The system according to any of embodiments 1-9 wherein the filter media is a hydrophobic ultra-high molecular weight polyethylene membrane.

Embodiment 12

The system according to any of embodiments 1-11 wherein the purge port is comprised in a first wall of the substrate container which faces an opposite wall of the substrate container across the interior of the substrate container; wherein the minimum distance between the purge port and the opposite wall is the height of the interior of the substrate container; wherein the purge diffuser has a purge diffuser length which is the distance that the purge diffuser extends toward the opposite wall when mounted to the purge port; and wherein the purge diffuser length is not more than 85% of the height of the interior of the substrate container.

Embodiment 13

The system according to embodiment 12 wherein the purge diffuser length is not more than 60% of the height of the interior of the substrate container.

Embodiment 14

The system according to embodiment 12 or 13 wherein the purge diffuser length is at least 20% of the height of the interior of the substrate container.

Embodiment 15

The system according to any of embodiments 1-14 wherein the purge port is comprised in a first wall of the substrate container which faces an opposite wall of the substrate container across the interior of the substrate container; wherein the minimum distance between the purge port and the opposite wall is the height of the interior of the substrate container; wherein the internal purge gas channel has an internal purge gas channel length which is the distance that the internal purge gas channel extends toward the opposite wall when the purge diffuser is mounted to the purge port; and wherein the internal purge gas channel length is not more than 85% of the height of the interior of the substrate container.

Embodiment 16

The system according to embodiment 14 wherein the internal purge gas channel length is not more than 60% of the height of the interior of the substrate container.

Embodiment 17

The system according to embodiment 14 or 15 wherein the internal purge gas channel length is at least 20% of the height of the interior of the substrate container.

Embodiment 18

The system according to any of embodiments 1-17 wherein the purge diffuser core additionally comprises one or more diverters which project into the internal purge gas channel from an inner surface of the purge diffuser core bordering the internal purge gas channel.

Embodiment 19

The system according to embodiment 18 wherein one or more diverters bridge across the internal purge gas channel from a first location on the inner surface of the purge diffuser core to a second location on the inner surface of the purge diffuser core, the second location being separated from the first location.

Embodiment 20

The system according to embodiment 17 or 19 wherein the diffuser core comprises one or more diverters in a first segment of the internal purge gas channel proximal to the purge port and does not comprise diverters in a second segment of the internal purge gas channel distal to the purge port.

Embodiment 21

The system according to embodiment 20 wherein the first segment is smaller than the second segment.

Embodiment 22

The system according to any of embodiments 1-21 wherein the diffuser ports are staggered such that every portion of the internal purge gas channel between the diffuser ports closest to the purge port connector and the diffuser port most distant from the purge port connector may be accessed through a diffuser port along a line perpendicular to the length of the purge diffuser.

Embodiment 23

The system according to any of embodiments 1-22 wherein the substrate container is a Front Opening Unified Pod (FOUP).

Embodiment 24

The system according to any of embodiments 1-23 wherein the substrates are semiconductor wafers.

Embodiment 25

A purge diffuser for use in a system for transporting substrates comprising:
 i) a purge diffuser core having an internal purge gas channel, one or more diffuser ports and an outer surface;
 ii) filter media secured to the outer surface of the purge diffuser core; and
 iii) a purge port connector for mounting the purge diffuser to a purge port of a substrate container for transporting substrates;
 arranged such that there is a continuous path for purge gas entering through the purge port connector to enter the internal purge gas channel, exit the internal purge gas channel through the diffuser ports, and pass through the filter media.

Embodiment 26

The purge diffuser according to embodiment 25 wherein the purge diffuser core is an integral construction.

Embodiment 27

The purge diffuser according to embodiment 25 wherein the purge diffuser core is a unitary article.

Embodiment 28

The purge diffuser according to any of embodiments 24-25 wherein the purge diffuser core is a unitary article comprising an injection-moldable material and made in a single molding.

Embodiment 29

The purge diffuser according to embodiment 28 wherein the injection-moldable material is a melt processable polymer.

Embodiment 30

The purge diffuser according to any of embodiments 25-29 wherein the filter media is directly bound to the outer surface of the purge diffuser core.

Embodiment 31

The purge diffuser according to any of embodiments 25-29 wherein the filter media is directly bound to the outer surface of the purge diffuser core by weld bonds.

Embodiment 32

The purge diffuser according to embodiment 31 wherein the filter media is directly bound to the outer surface of the purge diffuser core by weld bonds selected from heat-weld bonds, impulse-weld bonds and ultrasonic-weld bonds.

Embodiment 33

The purge diffuser according to any of embodiments 25-29 wherein the filter media is secured to the outer surface of the purge diffuser core by an adhesive.

Embodiment 34

The purge diffuser according to any of embodiments 25-29 wherein the filter media is secured to the outer surface of the purge diffuser core by a filter media bracket, wherein the filter media is secured between the purge diffuser core and the filter media bracket and the filter media bracket is attached to the purge diffuser core.

Embodiment 35

The purge diffuser according to any of embodiments 25-29 wherein the filter media is a porous hydrophobic film comprising a polyolefin, polyester, polysulfone, or fluoropolymer.

Embodiment 36

The purge diffuser according to any of embodiments 25-35 wherein the filter media has a thickness of between 10 and 1300 micrometers.

Embodiment 37

The purge diffuser according to any of embodiments 25-36 wherein the purge diffuser core additionally comprises one or more diverters which project into the internal purge gas channel from an inner surface of the purge diffuser core bordering the internal purge gas channel.

Embodiment 38

The purge diffuser according to embodiment 37 wherein one or more diverters bridge across the internal purge gas channel from a first location on the inner surface of the purge diffuser core to a second location on the inner surface of the purge diffuser core, the second location being separated from the first location.

Embodiment 39

The purge diffuser according to embodiment 37 or 38 wherein the diffuser core comprises one or more diverters in a first segment of the internal purge gas channel proximal to the purge port connector and does not comprise diverters in a second segment of the internal purge gas channel distal to the purge port connector.

Embodiment 40

The purge diffuser according to embodiment 39 wherein the first segment is smaller than the second segment.

Embodiment 41

The purge diffuser according to any of embodiments 25-40 wherein the diffuser ports are staggered such that every portion of the internal purge gas channel between the diffuser port closest to the purge port connector and the diffuser port most distant from the purge port connector may be accessed through a diffuser port along a line perpendicular to the length of the purge diffuser.

Embodiment 42

A method of making a purge diffuser according to any of embodiments 25-41 comprising:
a) molding the purge diffuser core as single unitary article; and
b) securing filter media to the outer surface of the purge diffuser core. Embodiment 43
The method according to embodiment 42 wherein step a) is accomplished by injection molding.

Embodiment 44

The method according to embodiment 42 or 43 wherein step b) is accomplished by welding.

Embodiment 45

The method according to embodiment 42 or 43 wherein step b) is accomplished by impulse welding.

Embodiment 46

The method according to embodiment 42 or 43 wherein step b) is accomplished by attaching a filter media bracket, wherein the filter media is secured between the purge diffuser core and the filter media bracket and the filter media bracket is attached to the purge diffuser core.

Embodiment 47

A method of purging a system for transporting substrates according to any of embodiments 1-24, comprising passing a flow of purge gas through the purge port into the purge diffuser and thereby into the interior of the substrate container.

Embodiment 48

The method according to embodiment 45 wherein the purge gas is nitrogen.

Embodiment 49

The method according to embodiment 45 wherein the purge gas is clean dry air (CDA).

Embodiment 50

The method according to embodiment 47 wherein the purge diffuser provides a greater flow of purge gas to lower portions of the interior of the substrate container than to higher portions of the interior of the substrate container.

Various modifications and alterations of this disclosure will become apparent to those skilled in the art without departing from the scope and principles of this disclosure, and it should be understood that this disclosure is not to be unduly limited to the illustrative embodiments set forth hereinabove.

What is claimed is:

1. A purge diffuser for use in a system for transporting substrates comprising:

i) a purge diffuser core having an internal purge gas channel, one or more diffuser ports and an outer surface;
ii) a filter media, comprising a porous polymer film or polymer membrane, secured to the outer surface of the purge diffuser core; and
iii) a purge port connector for mounting the purge diffuser to a purge port of a substrate container for transporting substrates; and
an arrangement such that there is a continuous path for purge gas entering through the purge port connector to enter the internal purge gas channel, exit the internal purge gas channel through the diffuser ports, and pass through the filter media.

2. The purge diffuser according to claim 1 wherein the purge diffuser core is a unitary article.

3. The purge diffuser according to claim 1 wherein the purge diffuser core is a unitary article comprising an injection-moldable, melt processable polymer.

4. The purge diffuser according to claim 1 wherein the filter media is directly bound to the outer surface of the purge diffuser core by weld bonds.

5. The purge diffuser according to claim 1 wherein the filter media is secured to the outer surface of the purge diffuser core by an adhesive.

6. The purge diffuser according to claim 1, further comprising a scrim disposed over the filter media.

7. The purge diffuser according to claim 1 wherein the filter media is a porous hydrophobic film comprising a polyolefin, polyester, polysulfone, or fluoropolymer.

8. The purge diffuser according to claim 1 wherein the filter media is a hydrophobic membrane comprising a polyolefin, polyester, polysulfone or fluoropolymer.

9. The purge diffuser according to claim 1 wherein the filter media is a hydrophobic ultra-high molecular weight polyethylene membrane.

10. The purge diffuser according to claim 1 wherein the purge diffuser core additionally comprises one or more diverters which project into the internal purge gas channel from an inner surface of the purge diffuser core bordering the internal purge gas channel.

11. The purge diffuser according to claim 1 wherein the diffuser ports are staggered such that every portion of the internal purge gas channel between the diffuser port closest to the purge port connector and the diffuser port most distant from the purge port connector is accessed through a diffuser port along a line perpendicular to the length of the purge diffuser.

12. A method of making a purge diffuser according to claim 1 comprising:
a) molding the purge diffuser core as single unitary article; and
b) securing filter media to the outer surface of the purge diffuser core.

13. The method according to claim 12 wherein step a) is accomplished by injection molding.

14. The method according to claim 12 wherein step b) is accomplished by welding.

15. The purge diffuser according to claim 1 wherein the filter media is a porous polymer film.

16. A system for transporting substrates comprising:
a) a substrate container comprising a container portion with an opening, a door adapted to be received in the opening, and a purge port to admit purge gas to an interior of the container portion; and
b) a purge diffuser mounted to the purge port by the purge port connector, arranged such that there is a continuous path for purge gas entering through the purge port to enter the internal purge gas channel, exit the internal purge gas channel through the diffuser ports, and pass through a filter media into the interior of the substrate container, wherein the purge port is defined in a first wall of the substrate container which faces an opposite wall of the substrate container across the interior of the substrate container; wherein a height of the substrate container is measured from a top wall to a bottom wall of the container portion and wherein a length of the purge diffuser is not more than 85% of the height the substrate container; and wherein the filter media comprising a porous polymer film or polymer membrane, and secured to the outer surface of the purge diffuser core.

17. The system according to claim 16 wherein the substrate container is a front opening unified pod (FOUP).

18. A method of purging a system for transporting substrates according to claim 16, comprising passing a flow of purge gas through the purge port into the purge diffuser and thereby into the interior of the substrate container.

19. The method according to claim 18 wherein the purge gas is nitrogen and the purge diffuser provides a greater flow of purge gas to lower portions of the interior of the substrate container than to higher portions of the interior of the substrate container.

* * * * *